(12) United States Patent
Takahashi et al.

(10) Patent No.: US 6,304,152 B1
(45) Date of Patent: Oct. 16, 2001

(54) DIGITAL-CONTROL COLPITTS OSCILLATOR CIRCUIT

(75) Inventors: Yutaka Takahashi; Kouji Nakamura, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/628,356

(22) Filed: Jul. 28, 2000

(30) Foreign Application Priority Data

Aug. 12, 1999 (JP) .................................................. 11-228201

(51) Int. Cl.[7] ...................................................... H03B 5/36
(52) U.S. Cl. ................................. 331/116 FE; 331/116 R; 331/158; 331/179
(58) Field of Search .............................. 331/36 C, 116 R, 331/116 FE, 116 M, 117 R, 117 FE, 117 D, 158, 177 R, 177 V, 179

(56) References Cited

U.S. PATENT DOCUMENTS

| 5,493,715 | * | 2/1996 | Humphreys et al. | 455/264 |
| 5,600,279 | * | 2/1997 | Mori | 331/36 C |

FOREIGN PATENT DOCUMENTS

| 57-132406 | 8/1982 | (JP) . |
| 5-218738 | 8/1993 | (JP) . |

* cited by examiner

*Primary Examiner*—David Mis
(74) *Attorney, Agent, or Firm*—Foley & Lardner

(57) ABSTRACT

The Colpitts circuit is configured so that an equivalent capacitance of the voltage-dividing first and second capacitors connected in series through the output of the transistor amplifier is variable under the condition that the ratio of the capacitance of the first capacitor to that of the second capacitor is kept unchanged at a prescribed value. The first and second capacitors are, as a whole, configured as a matrix of elemental capacitors with 2 rows and a plural number n of columns, an array of the elemental capacitors in the first row being allotted to the first capacitor and an array of the elemental capacitors in the second row being allotted to the second capacitor. Two elemental capacitors in each column j (j=1, 2, . . . n) are connected in series and the ratio of the capacitance of the elemental capacitor corresponding to the 1j element of the matrix to the capacitance of the elemental capacitor corresponding to the 2j element has the prescribed value. The Colpitts circuit further has a first switch and a second switch allotted to each of the columns. Each of the elemental capacitors allocated to the first row is connected to the control electrode of the transistor amplifier through the first switch, and the junction of the two elemental capacitors allocated to each column is connected to the output of said transistor amplifier through the second switch. The first and second switches are operated synchronously for every column.

8 Claims, 9 Drawing Sheets

(a)

(b)

(a)

(b)

DIGITAL-CONTROL COLPITTS OSCILLATOR CIRCUIT

BACKGROUND OF THE INVENTION

1. Field of the Invention

The present invention relates to a digital-control oscillator circuit provided with an oscillator element and capacitor element, capable of changing the oscillation frequency by changing the capacitance of the load capacitor through a digital signal.

2. Description of the Related Art

An oscillator circuit employing an oscillator element such as a quartz oscillator or a ceramic oscillator provides an oscillation frequency of a high accuracy and a high stability. The oscillator element needs a load. A capacitive element is commonly employed for the load. A change in a capacitance of the capacitive element (hereinafter, referred to as a load capacitor) causes a change in an oscillation frequency of the oscillator circuit.

Oscillator circuits, even when produced in a settled manufacturing process, sometimes have a fluctuation in the oscillation frequency. When the fluctuation goes beyond a tolerance range, the oscillation frequency is adjusted by varying the capacitance of the load capacitor so as to have the frequency fall within a permissible range.

Japanese Patents Laid-open S57-132406 and H05-218738 (hereinafter referred to as D1 and D2, respectively) describe oscillator circuits capable of adjusting an oscillation frequency by changing the capacity of the load capacitor. D1 describes a technique to change the capacitance of the load capacitor depending on the characteristic of the piezoelectric oscillator, while D2 describes a technique to change the capacitance of the load capacitor depending on the temperature variation.

FIG. 1 shows a traditional digital-controlled oscillator circuit of the Colpitts type. The oscillator circuit has a parallel-resonance tank circuit made up of a crystal oscillator 1, a first capacitor circuit 2 and a second capacitor circuit 3 connected in parallel.

Crystal (quartz) oscillator 1 is connected between gate line 11 and the ground potential.

The oscillator circuit is further provided with a source-follower circuit 4 made up of an N-MOS transistor 9 with a source thereof connected with an emitter-grounded constant-current source 10.

First capacitor circuit 2 has two voltage-dividing capacitors 5 and 6 in series with one electrode of capacitor 5 connected to the gate of transistor 9, their common connection 13 connected to output 14 of source follower 4 and another electrode of capacitor 6 being grounded.

First capacitor circuit 2 acts as a main load capacitor. The capacitors 5 and 6 of first capacitor circuit 2 have capacitances C1 and C2, respectively.

The values of C1 and C2 are determined from both the desired oscillation frequency and the predetermined ratio of C1 to C2, wherein the ratio C1/C2 is determined so as to ensure a stable oscillation of the oscillator circuit.

Second capacitor circuit 3 has capacitor 7 of capacitance C3 and switch 8 for connecting capacitor 7 in parallel to or disconnecting it from the tank circuit.

The tank circuit is connected between gate line 11 and the ground potential.

The bias potential for the gate line 11 is supplied from the junction of two voltage-dividing resistors 15 and 16 connected in series between voltage source VDD and the ground potential.

FIG. 2 illustrates the constitution of the Colpitts oscillator circuit shown in FIG. 1: (a) the basic circuit; (b) the equivalent circuit.

Since the transistor amplifier is a source-follower, the basic circuit of the Colpitts oscillator circuit is represented in a drain-grounded configuration.

In FIG. 2(a), the reactance of crystal oscillator 1 is represented as L, and the dotted lines represent on/off of switch 8. In FIG. 2(b), $X_2$ denotes the equivalent reactance to the parallel reactances of crystal oscillator 1 and capacitor 7. It follows that $X_2$ equals $jL\omega$ if switch 8 is off and equals $-j[C_3\omega - (L\omega)^{-1}]^{-1}$ if switch 8 is on. In the figure, $v_A$ and $v_B$ denote an input voltage (gate-source voltage) and an output voltage (source-ground voltage), respectively. The $g_m$ and $g_d$ stand for a transconductance and an internal conductance, respectively, and $g_m v_A$ represents a voltage-controlled current source, as usual.

The equivalent circuit gives an admittance $y_0 = i_o/v_B$ as viewed from 1 and 1' as follows:

$$y_0 = \frac{1}{jX_2 - j\frac{1}{C_1\omega}} + \frac{-j\frac{1}{C_1\omega}}{jX_2 - j\frac{1}{C_1\omega}} g_m + g_d + jC_2\omega \quad (1)$$

$$= \text{Real}(y_0) + j\,\text{Imaginary}(y_0),$$

where $$\text{Real}(y_0) = -\frac{1}{X_2 C_1 \omega - 1} g_m + g_d \quad (2)$$

$$\text{Imaginary}(y_0) = -\frac{C_1 \omega}{X_2 C_1 \omega - 1} + C_2 \omega, \quad (3)$$

$X_2 = jL\omega$ when switch 8 is off, and $$X_2 = -\frac{\frac{L}{C_3}}{L\omega - \frac{1}{C_3\omega}}$$

when switch 8 is on.

Equating Imaginary($y_0$) to 0 gives the frequency condition $$X_2\omega[C_1 C_2/(C_1+C_2)] = 1. \quad (4)$$

Generation of a stable oscillation requires further condition for sustaining a resonance oscillation without decay. This condition will hereinafter be referred to as an oscillation condition.

The oscillation condition is given by the inequality $$\text{Real}(y_0) < 0, \quad (5)$$

i.e., $$-\frac{1}{X_2 C_1 \omega - 1} g_m + g_d < 0 \quad (6)$$

Substitution of equation (4) to equation (6) yields the oscillation condition for a resonance frequency:

$$\frac{C_1}{C_2} \frac{g_m}{g_d} = \frac{C_1}{C_2} \mu > 1 \quad (7)$$

It is to be noted that the oscillation condition (5) is independent of $X_2$ at the resonance frequency as represented in inequality (7), while it relates to $X_2$ as represented in inequality (6) when the frequency is not at a resonance frequency.

It is an object of the present invention to provide a digital-control Colpitts crystal oscillator circuit of a modified type capable of changing an oscillator frequency sustaining a stable oscillation.

SUMMARY OF THE INVENTION

As is well known, a Colpitts oscillator circuit has: a transistor amplifier; voltage-dividing first capacitor and second capacitor with the first capacitor connected between an output of said transistor amplifier and a control electrode of the transistor amplifier and the second capacitor connected between the output of the transistor amplifier and an AC-ground potential; and an oscillator element connected between the control electrode of the transistor amplifier and the AC-ground potential.

In this circuitry, the first and second capacitors are connected in series through the output of the transistor amplifier, and the series-connected first and second capacitors act as a load capacitor of the parallel resonance tank circuit. Thus, changing the equivalent capacitance of the series capacitors caused the resonance frequency.

However, an arbitrary change of the equivalent capacitance does not always guarantee sustention of a stable oscillation.

The analysis of the Colpitts oscillation circuit shows that the feedback gain of the Colpitts oscillation circuit, namely the ratio of the input voltage to output ratio of the transistor amplifier, is proportional to the ratio of the capacitance of the first capacitor to that of the second capacitor, at a resonance frequency.

Thus, changing the oscillation frequency while sustaining a stable oscillation can be attained by configuring the capacitance of the load capacitor to be variable under the condition that the ratio of the capacitance of a first capacitor to that of a second capacitor is kept unchanged at a prescribed value. The value of the ratio is prescribed so that a stable oscillation is sustained.

The Colpitts oscillator circuit of the present invention has a resonance circuit featured by a load capacitor: the capacitance of the load capacitor is variable under the condition that the ratio of the capacitance of a first capacitor to that of a second capacitor is kept unchanged at a prescribed value.

It is preferred that the first capacitor and the second capacitor are, as a whole, configured as a matrix of elemental capacitors with 2 rows and a plural number n of columns.

In this matrix, an array of the elemental capacitors in the first row is allotted to the first capacitor and an array of the elemental capacitors in the second row is allotted to the second capacitor. Two elemental capacitors in each column j (j=1, 2, . . . n) are connected in series. The ratio of the capacitance of the elemental capacitor corresponding to the 1j element of the matrix to the capacitance of the elemental capacitor corresponding to the 2j element has said prescribed value.

In addition, the Colpitts oscillator circuit has a first switch and a second switch allotted to each of the columns. Each of the elemental capacitors allocated to the first row is connected to the control electrode of the transistor amplifier through the first switch. The junction of the two elemental capacitors allocated to each column is connected to the output of the transistor amplifier through the second switch. The first and second switches are operated synchronously for every column.

The Colpitts oscillator circuit is further provided with control means for controlling operations of the switches on a column basis.

The control means is provided with a buffer circuit and a control circuit. The buffer circuit is provided for providing serial data corresponding to set-up data in synchronization with a clock signal. The set-up data designates on/off of the switches for individual columns to realize a prescribed load capacitance of the resonance circuit.

A control circuit provides a control signal corresponding to the serial data for controlling operations of the first and second switches for every column.

The capacitances of the elemental capacitors in an arbitrary column are preferably determined to be twice those of corresponding elemental capacitors in the preceding column as viewed from the first column toward the last column.

This way of determining the capacitances of the elemental capacitors allows the set-up data to be described as binary data.

The above and other objects, features and advantages of the present invention will become apparent from the following description referring to the accompanying drawings which illustrate examples of preferred embodiments of the present invention.

DETAILED EXPLANATION OF THE PREFERRED EMBODIMENT

We will now set forth preferred embodiments of the present invention with reference to drawings.

Figure 3:
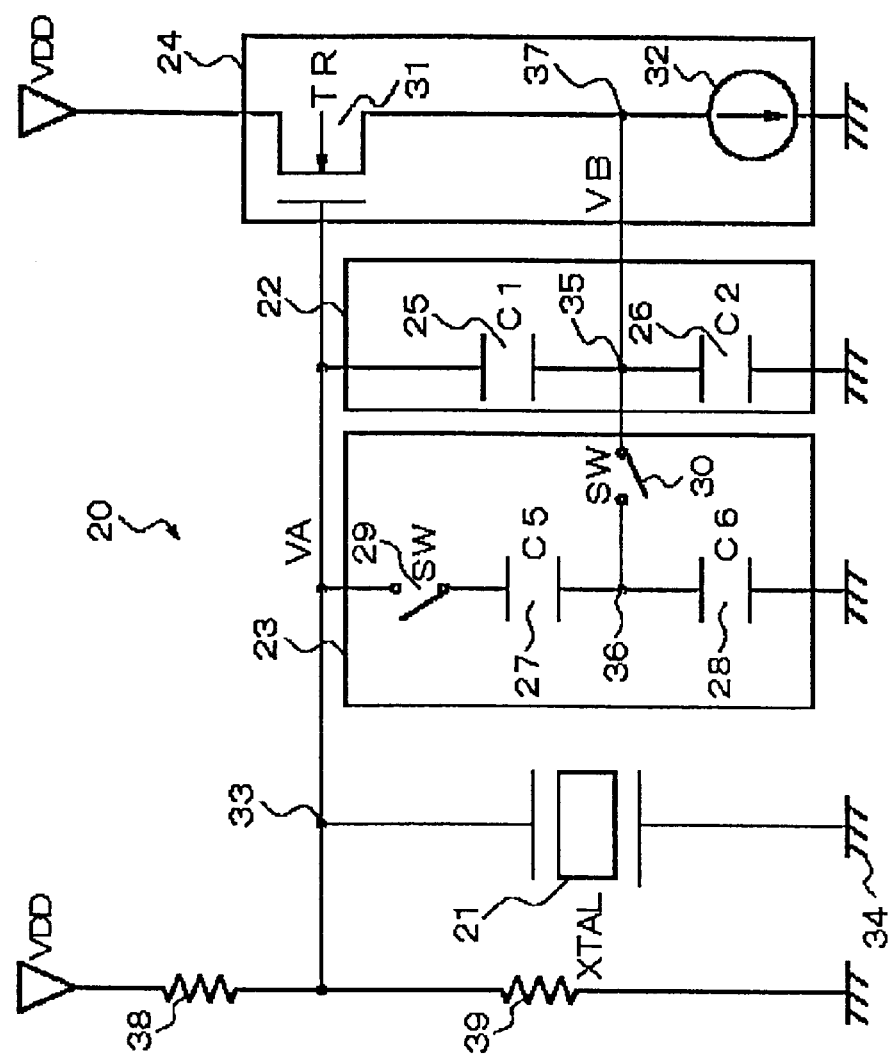
FIG. 3 represents a first embodiment of a digital-control Colpitts oscillator circuit of the present invention.

FIG. 3 represents a first embodiment of a digital-control Colpitts oscillator circuit of the present invention.

The Colpitts oscillator circuit has a parallel-resonance tank circuit made up of crystal oscillator 21, a first capacitor circuit 22 and a second capacitor circuit 23 connected in parallel. The tank circuit is connected between gate line 33 and the ground potential The Colpitts oscillator circuit is provided with a source-follower circuit 24 made up of an N-MOS transistor 31 with a source thereof connected with a constant-current source 32.

First capacitor circuit 22 has two voltage-dividing capacitors 25 and 26 connected in series with their common connection 35 connected to output 37 of source follower circuit 24. Both end electrodes of the serially connected capacitors 25 and 26 are connected to gate line 33 and the ground potential, respectively.

First capacitor circuit 22 acts as a main load capacitor (a main resonance capacitor). Capacitors 25 and 26 have capacitances C1 and C2, respectively, with the ratio C1/C2 determined so as to ensure a stable oscillation of the oscillator circuit.

Thus, the values of C1 and C2 are determined so as to satisfy both oscillation condition (5) and frequency condition (4) with $X_2$ substituted by the reactance of the crystal oscillator (hereinafter, denoted by jLω).

Second capacitor circuit 23 has serially connected capacitors 27 and 28 of capacitances C5 and C6, respectively, and switches 29 and 30 that operate synchronously in response to a control signal. Switch 29 switches the connection between an electrode of capacitor 27 and gate line 33. Switch 30 switches the connection between nodes 36 and 35, wherein node 36 is a common connection of the electrodes of capacitors 27 and 28. Another electrode of capacitor 28 is grounded.

The capacitances C5 and C6 are determined so that the ratio C5/C6 substantially equals the ratio C1/C2. Since a feedback gain of a Colpitts oscillator is proportional to the ratio C1/C2, simultaneous switching of switches 29 and 30, that is, simultaneous parallel connection of capacitors 27 and 28 to capacitors 25 and 26, respectively, or reversely, simultaneous disconnection of capacitors 27 and 28 from capacitor 25 and capacitor 26, respectively, will cause substantially no change in the feedback gain of the Colpitts oscillator circuit. Thus, a frequency change can be effected under sustaining a stable oscillation.

The bias potential for the gate line 33 is supplied from the junction of two voltage-dividing resistors 38 and 39 connected in series between voltage source VDD and the ground potential 34.

Figure 4:
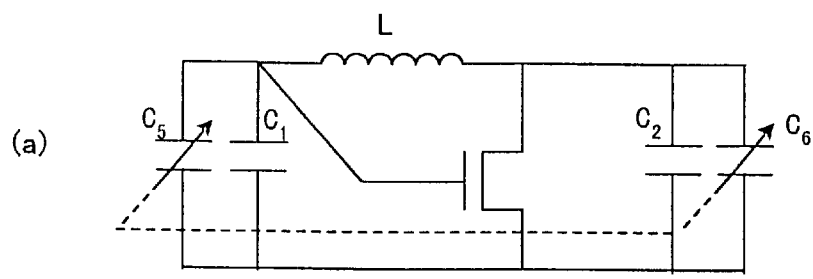
FIG. 4 illustrates the constitution of the Colpitts oscillator circuit shown in FIG. 3: (a) the basic circuit and (b) the equivalent circuit.
Figure 4:
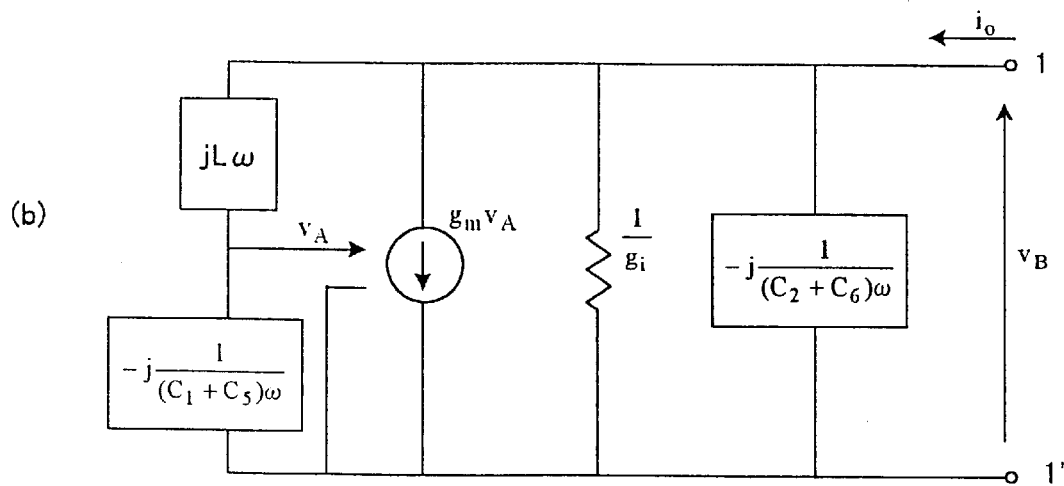

FIG. 4 illustrates the constitution of the Colpitts oscillator circuit shown in FIG. 3: (a) the basic circuit; (b) the equivalent circuit where switches 29 and 30 are turned on. In FIG. 4, the reactance of the crystal oscillator is represented as jLω. In FIG. 4(a), the simultaneous switching of switches 29 and 30 is represented by the two parallel arrows.

In this circuit, as the case with equation (4) and inequality (7), the feedback gain $v_A/v_B$ is, at the resonance frequency, $$\frac{v_A}{v_B} = \frac{-j\frac{1}{(C_1+C_5)\omega}}{-j\frac{1}{(C_2+C_6)\omega}}. \quad (8)$$

Since $C_5/C_6 = C_1/C_2$, $v_A/v_b = C_2/C_1$ and the oscillation condition becomes $$\frac{C_1}{C_2}\frac{g_m}{g_d} = \frac{C_1}{C_2}\mu > 1. \quad (9)$$

As a result, the oscillation condition is unaffected by connection of capacitor 27 and 28.

The resonance frequency changes by the switching from $$f = \frac{1}{2\pi\sqrt{L\left(\frac{C_1 C_2}{C_1 + C_2}\right)}}$$

to $$f = \frac{1}{2\pi\sqrt{L\left(\frac{(C_1+C_5)(C_2+C_6)}{C_1+C_2+C_5+C_6}\right)}}.$$

Figure 5:
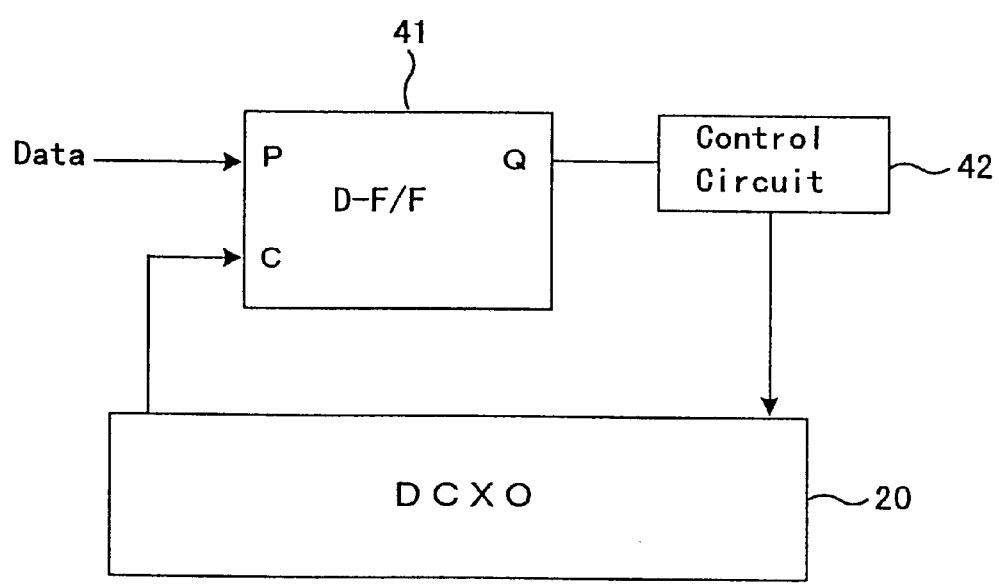
FIG. 5 shows a peripheral circuit for the digital-control Colpitts oscillator circuit according to the present invention.

FIG. 5 shows a peripheral circuit for the digital-control Colpitts oscillator circuit according to the present invention.

The peripheral circuit has buffer 41 and control circuit 42. Control circuit 42 is supplied with an output of buffer 41 and controls the load capacitance of digital-control oscillator (DCXO) 20 in response to the output of buffer 41.

Buffer 41 is a D flip-flop having a D-input, a C-input and a Q-output: the D-input receives set-up data for specifying the equivalent capacitance of the capacitors in the oscillator DCXO; a C-input is supplied with a clock signal from oscillator 20; and Q-output provides serial data corresponding to the set-up data as an output in synchronization with the clock signal. Control circuit 42 supplies a control signal corresponding to the serial data to serve for on/off-control of switches 29 and 30 of DCXO 20.

When the oscillation frequency is to be lowered by increasing the load capacitance of DCXO 20, the set-up data is rendered active, which is next transformed into serial data in buffer 41. The control circuit 42 turns on both switches 29 and 30 according to the content of the serial data. Switching-on of switch 29 causes series-connected capacitors 27 and 28 to be connected to the tank circuit. Switching-on of switch 30 causes capacitors 25 and 27 as well as capacitors 26 and 28 to be connected in parallel. In this way, the simultaneous switching-on of switches 29 and 30 produces a series connection of the parallel capacitances $C_1+C_5$ and $C_2+C_6$ for the load capacitance of the tank circuit.

When the oscillation frequency is to be raised by decreasing the load capacitance of DCXO 20, the set-up data is rendered inactive. The control circuit 42 turns off both switches 29 and 30, thereby making the load capacitance of crystal oscillator 21 equal to the equivalent capacitance of the serially combined capacitances C1 and C2.

Figure 1:
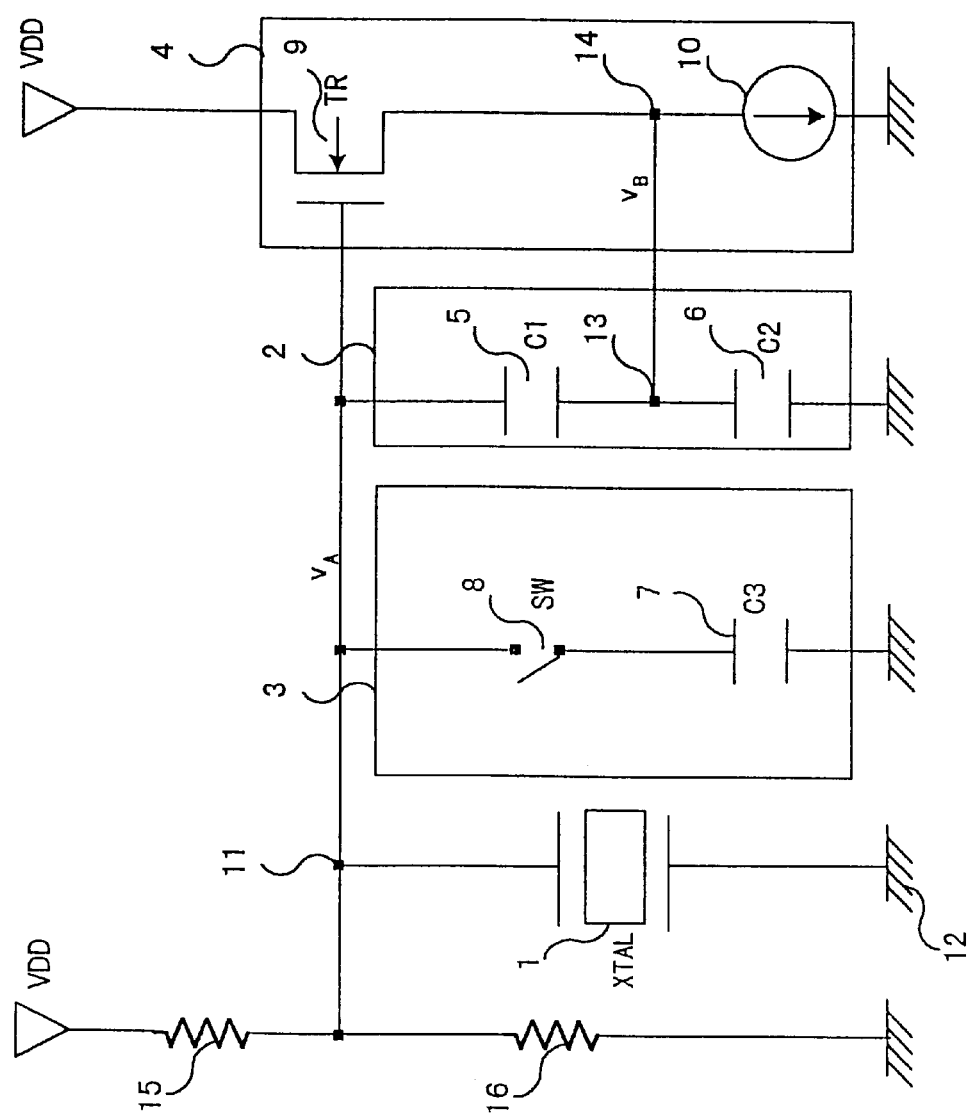
FIG. 1 shows a traditional digital-control oscillator circuit of the Colpitts type.
Figure 2:
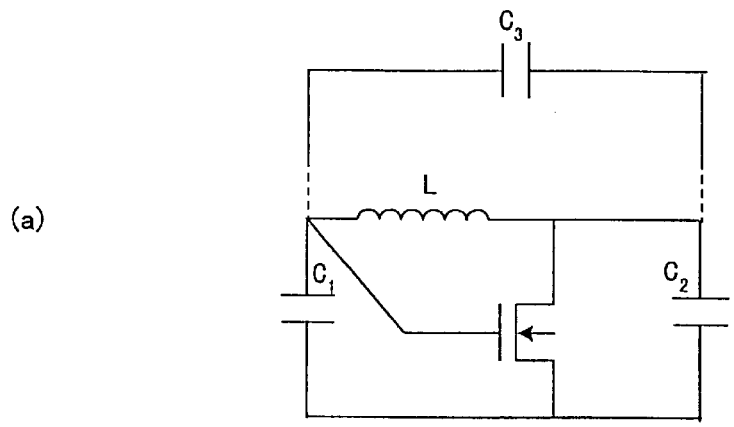
FIG. 2 illustrates the constitution of the Colpitts oscillator circuit shown in FIG. 1: (a) the basic circuit and (b) the equivalent circuit.
Figure 2:
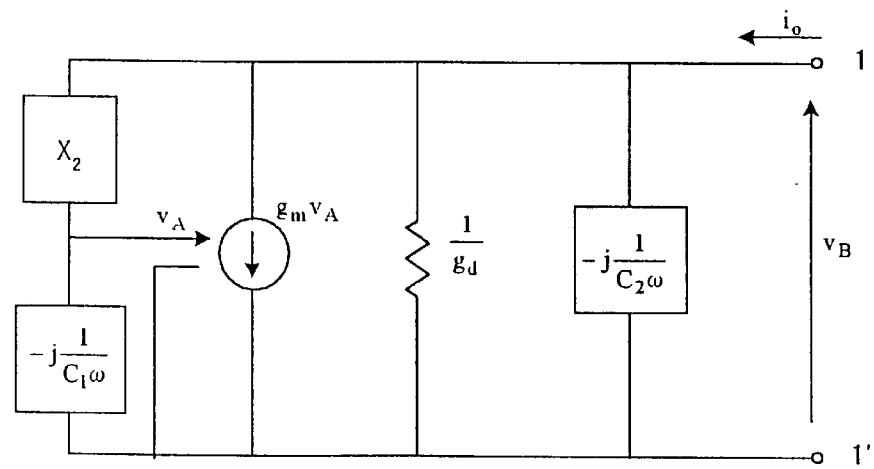
Figure 6:
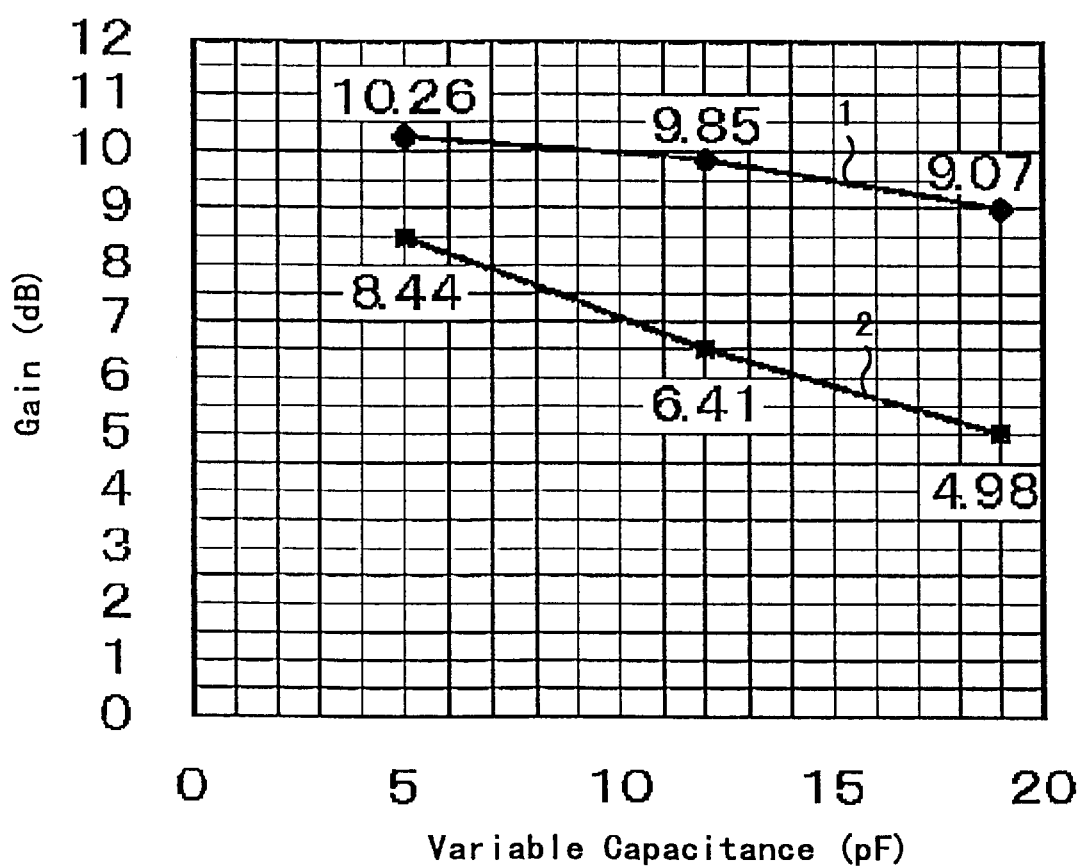
FIG. 6 represents the feedback gain plotted against the load capacitance of the digital-control oscillator.

FIG. 6 represents the feedback gain plotted against the load capacitance of the digital-control oscillator: the curve labeled with numeral 1 is for the present invention and the curve labeled with numeral 2 for the traditional digital-control oscillator depicted in FIG. 1.

The oscillator circuit 20 of the present invention exhibits a gain change from 10.26 dB to 9.07 dB for the equivalent capacitance change from 5 pF to 20 pF, namely, 12% in the rate of change. In the traditional oscillator circuit, on the other hand, the gain changes from 8.44 dB to 4.98 dB for the equivalent capacitance change from 5 pF to 20 pF, namely, approximately 41% in the rate of change. These values indicate the rate of a gain change in the present invention one third that in the traditional oscillator circuit. While oscillator circuit 20 of the present invention should theoretically cause no change in the gain, a minor change in the gain will possibly be due to the operation characteristic of amplifier 24 and the distributed capacitance of the circuit in practical applications.

Figure 7:
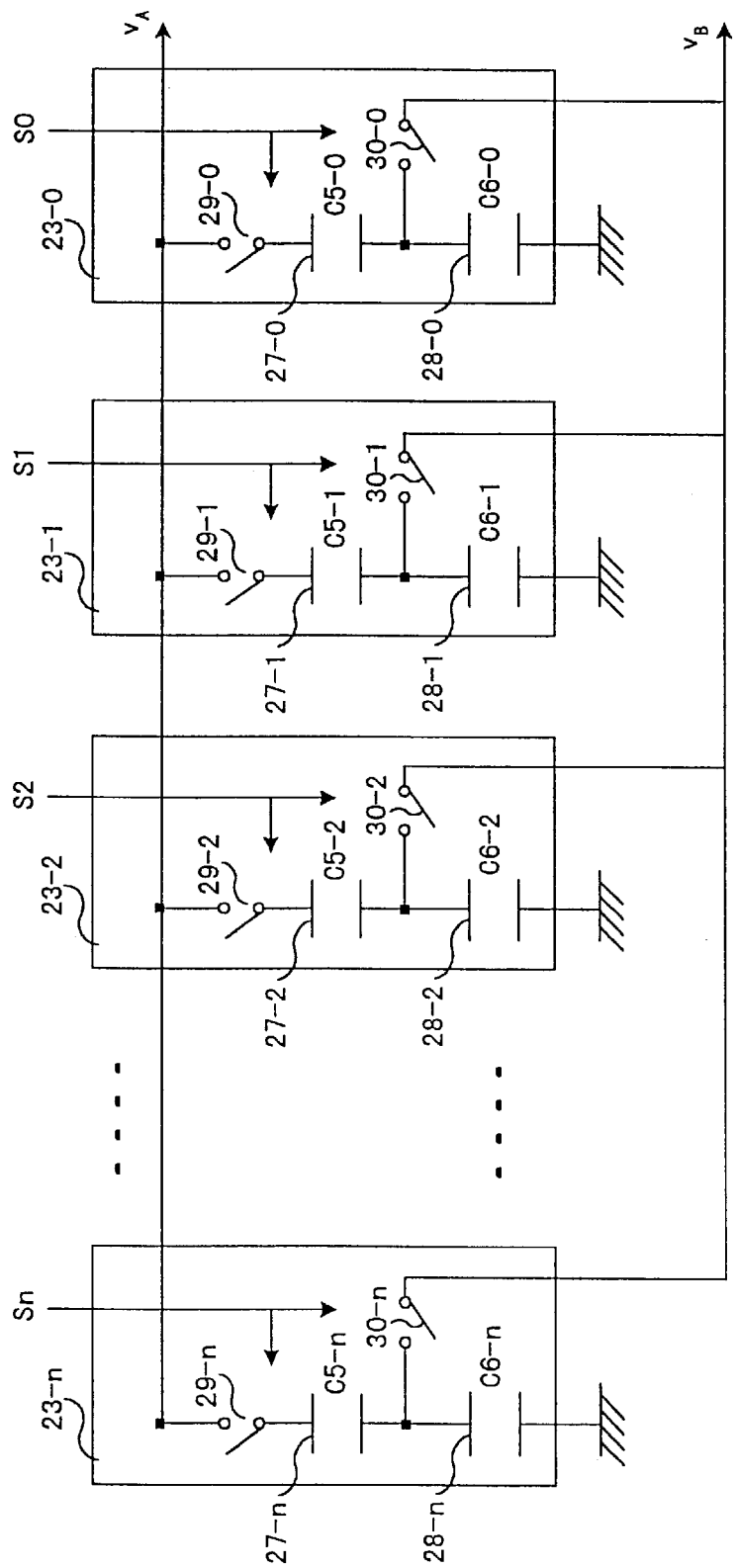
FIG. 7 represents a second embodiment of the digital-control Colpitts oscillator circuit according to the present invention.

FIG. 7 represents a second embodiment of the digital-control Colpitts oscillator circuit according to the present invention.

In this embodiment, the capacitors are, as a whole, configured as a matrix of elemental capacitors with 2 rows and a plural number n+1 of columns. Two elemental capacitors in each column j (j=0,1, 2, . . . n) are connected in series and the ratio of the capacitance of the 1j elemental capacitor (the elemental capacitor corresponding to the 1j element of the matrix) to the capacitance of the 2j elemental capacitor is prescribed so that a stable oscillation can be sustained.

In addition, a first switch 29-j (j=0, 1, . . . n) and a second switch 30-j are allotted to each j of said columns. Each of the elemental capacitors 27-j allocated to the first row is connected to the gate of transistor 31 through first switch 29-j, and the junction of the two elemental capacitors 27-j and 28-j allocated to each column j is connected to the output of transistor 31 through second switch 30-j. First switch 29-j and second switch 30-j are operated synchronously for every column.

In the figure, only the matrix configuration of capacitor circuit 23-j (j=0,1, . . . n) are shown. Other constituent elements including capacitor circuit 22 are omitted, because these elements are the same as shown in FIG. 3. The capacitor circuit 23-0 (j=0) is identical with second capacitor circuit 23 shown in FIG. 3. Hereinafter, capacitor circuits 23-0~23-n are generally referred to as additional capacitor circuits.

We will set forth the matrix configuration of the additional capacitor circuit more specifically with reference to FIG. 7. Additional capacitor circuits 23-0~23-n (j=0 . . . n) are provided with first additional capacitors 27-0~27-n (the first row) and second additional capacitors 28-0~28-n (the second row), respectively. Additional capacitor circuits 23-0~23-n are further provided with switches 29-0~29-n and 30-0~30-n, respectively.

In each of additional capacitor circuit 23-j, capacitors 27-j and 28-j (j column of the matrix) are connected in series with their common connection connected with the output of source follower circuit 24 through switch 30-j. The remaining electrode of capacitor 27-j is connected with gate line 33 through switch 29-j. The remaining electrode of capacitor 28-j is grounded.

Additional capacitor circuits 23-0~23-n are connected with control-signal lines $S_0$~$S_n$ to control switching of switches 29-1~29-n and 30-1~30-n.

Setting-up the states of control lines $S_0$~$S_n$ specifies the way of combining additional capacitor circuits 23-0~23-n. Thus, a designed variation in the states of control lines $S_0$~$S_n$ allows a desired change in the equivalent capacitance of the load capacitor of the tank circuit.

The states of control lines $S_0$~$S_n$ can be set up to "active" successively from control line $S_0$ to $S_n$ one by one, wherein the "active" state of the control line controls the switch to be on. It is also possible to set up exclusively predetermined one control line or plural control lines to "active".

Figure 8:
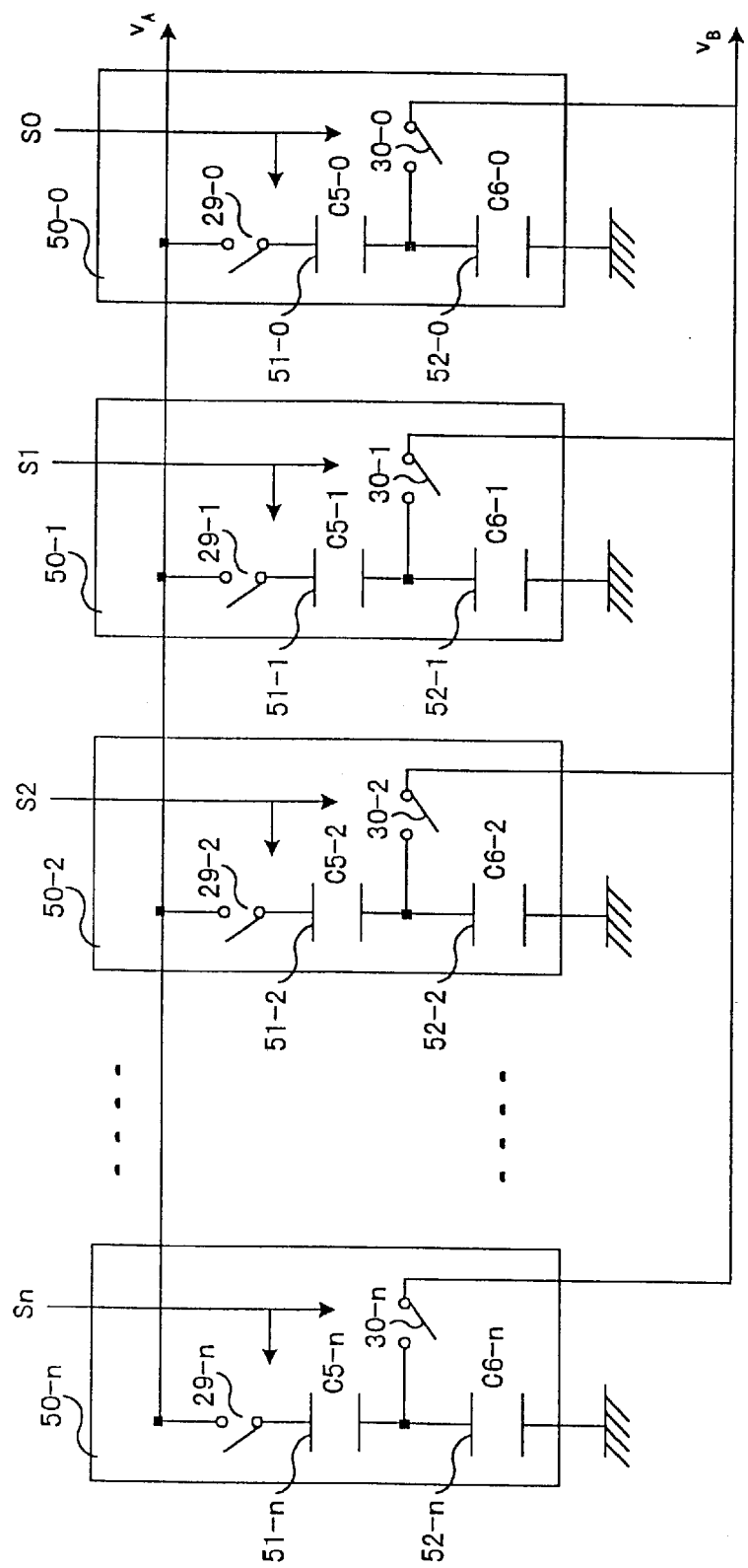
FIG. 8 represents a third embodiment of the digital-control Colpitts oscillator circuit according to the present invention.

FIG. 8 represents further embodiment of the digital-control Colpitts oscillator circuit according to the present invention. In the figure, only additional capacitor circuits 50-0~50-n are shown. Other constituent elements are omitted, because these elements are the same as shown in FIG. 3. Capacitor circuit 23-0 is identical with second capacitor circuit 23 shown in FIG. 3. Additional capacitor circuits 50-0~50-n are provided with first additional capacitors 51-0~51-n and second additional capacitors 52-0~52-n, respectively. Additional capacitor circuits 50-0~50-n are further allotted with switches 29-0~29-n and 30-0~30-n, respectively.

Capacitance C5-1 of first additional capacitor 51-1 is designed to be twice that of capacitor 27-0 of capacitor circuit 23-0. Capacitance C5-2 of first additional capacitor 51-2 is designed to be four times ($2^2$) that of capacitor 27-0 of capacitor circuit 23-0. Capacitance C5-n of first additional capacitor 51-n is designed to be $2^n$ times that of capacitor 27-0 of capacitor circuit 23-0.

Capacitance C6-1 of second additional capacitor 52-1 is designed to be twice that of capacitor 28-0 of capacitor circuit 23-0. Capacitance C6-2 of second additional capacitors 52-2 is designed to be four times that of capacitor 28-0 of capacitor circuit 23-0. Capacitance C6-n of second additional capacitors 52-n is designed to be $2^n$ times that of capacitor 28-0 of capacitor circuit 23-0.

Setting-up the states of control lines $S_0$~$S_n$ specifies the way of combining additional capacitor circuits 50-0~50-n. Thus, a designed variation in the states of control lines $S_0$~$S_n$ allows a desired change in the resultant capacitance of the load capacitor of the tank circuit.

The states of control lines $S_0$~$S_n$ can be set up to "active" successively from control line $S_0$ to $S_n$ one by one. It is also possible to set up exclusively predetermined one control line or plural control lines to "active".

Additional capacitor circuits 50-1~50-n shown in FIG. 8 provides an advantage of having a wider set-up range than that of the circuit shown in FIG. 7, provided that the number of the control lines is the same.

Figure 9:
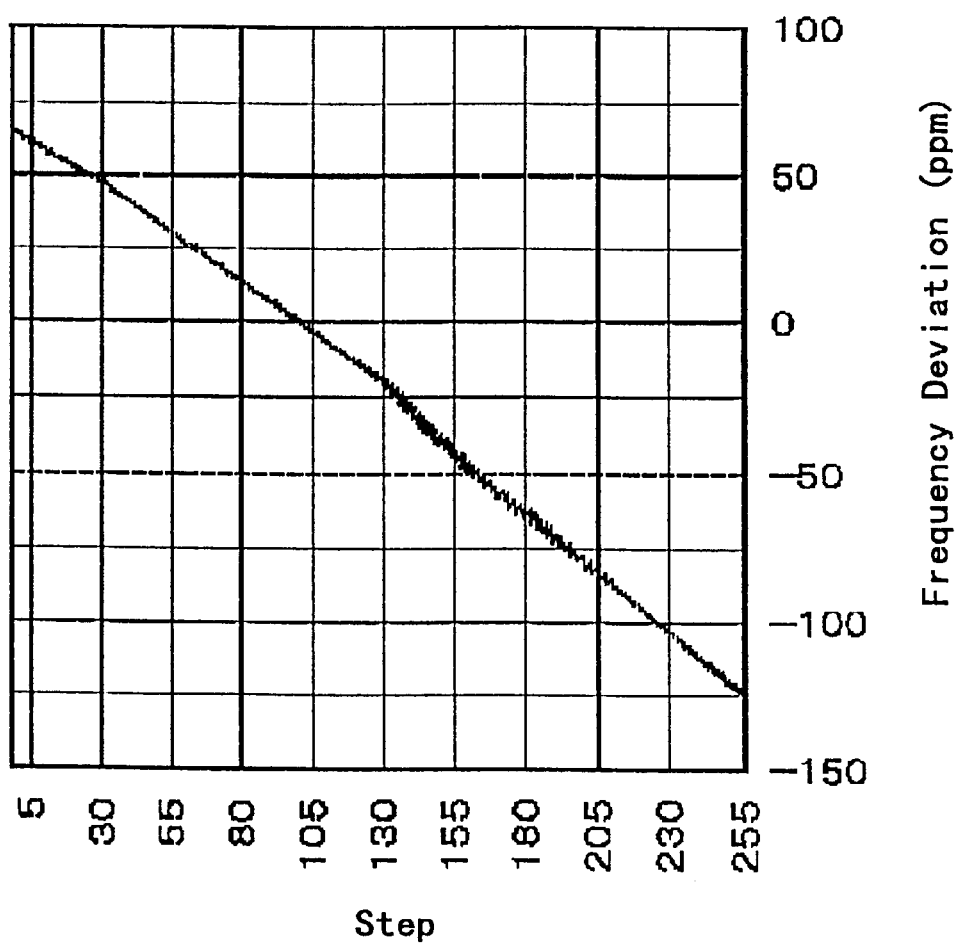
FIG. 9 is a diagram to illustrate the operation of the digital-control Colpitts oscillator circuit of the present invention showing the operation of the oscillator circuit provided with 254 additional capacitor circuits 23-0~23-253.

FIG. 9 is a diagram to illustrate the operation of the digital-control Colpitts oscillator circuit of the present invention showing the operation of the oscillator circuit provided with 254 additional capacitor circuits 23-0~23-253.

In the illustrated embodiment, the frequency generated by the tank circuit having a load capacitance of 105 additional capacitor circuits set up to an active state is regarded as a reference frequency.

The frequency is varied by varying the load capacitance by changing the number of the active additive capacitor circuits, as described above. Thirty additional capacitor circuits placed in the active state cause the oscillation frequency to be deviated by +50 ppm from the reference frequency. One hundred sixty additional capacitor circuits placed in the active state cause the oscillation frequency to be deviated by −50 ppm from the reference frequency. In the illustrated embodiment, the +50 ppm deviation and −50 ppm deviation are established as an upper standard limit and a lower standard limit, respectively.

The digital-control oscillator circuit of the present invention can be realized in a one-chip integrated circuit.

The first switches 29-0~29-n and the second switches 30-0~30-n are preferably fuse switches if it is unnecessary to repeat switch-on and switch off.

It is to be noted that the number and combination of the control signals set up to "active" can be arbitrary established in the present invention.

Finally, the present invention offers the following advantages: since the change in the load capacitance does not affect the feedback gain, it is possible to design a tank circuit having a wide range variation of the load capacitance; and it is also possible to avoid difficulty in adjusting the oscillation frequency caused by a wide range variation of the load capacitance, whereby the yield of the product is promoted.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A digital-control Colpitts oscillator circuit having: a transistor amplifier; a first capacitor connected between an output of said transistor amplifier and a control electrode of said transistor amplifier; a second capacitor connected between said output of said transistor amplifier and an AC-ground potential; and an oscillator element connected between said control electrode of said transistor amplifier and said AC-ground potential; said first capacitor, said second capacitor and said oscillator element making up a parallel resonance circuit, and an equivalent capacitance of said first capacitor and said second capacitor connected in series through said output of said transistor amplifier being variable under the condition that the ratio of the capacitance of said first capacitor to that of said second capacitor is kept unchanged at a prescribed value.

2. An oscillator circuit as claimed in claim 1, wherein said first capacitor and said second capacitor are, as a whole, configured as a matrix of elemental capacitors with 2 rows and a plural number n of columns, an array of the elemental capacitors in the first row being allotted to said first capacitor and an array of the elemental capacitors in the second row being allotted to said second capacitor; wherein two elemental capacitors in each column j (j=1, 2, . . . n) are connected in series and the ratio of the capacitance of the elemental capacitor corresponding to the 1j element of the matrix to the capacitance of the elemental capacitor corresponding to the 2j element has said prescribed value; wherein a first switch and a second switch are allotted to each of said columns and each of the elemental capacitors allocated to the first row is connected to said control electrode of said transistor amplifier through said first switch, and the junction of the two elemental capacitors allocated to each column is connected to said output of said transistor amplifier through said second switch; and wherein said first switch and said second switch are operated synchronously for every column.

3. An oscillator circuit as claimed in claim 2, further provided with control means for controlling operations of said switches on a column basis.

4. An oscillator circuit as claimed in claim 2, wherein said first switch and said second switch are fuse switches.

5. An oscillator circuit as claimed in claim 3, wherein said control means is provided with: a buffer means for providing serial data corresponding to set-up data in synchronization with a clock signal, said set-up data designating on/off of the switches for individual columns to realize a prescribed load capacitance of said resonance circuit of said oscillator circuit; and a control circuit for providing a control signal corresponding to said serial data for controlling operations of said first switch and said second switch for every column.

6. An oscillator circuit as claimed in claim 5, wherein the on/off of said first switch and said second switch is designated column-by-column from the first to the last column so that said prescribed load capacitance is yielded.

7. An oscillator circuit as claimed in claim 5, wherein the on/off of said first switch and said second switch is designated for every arbitrary column or every plural columns so as to yield a prescribed resultant load capacitance.

8. An oscillator circuit as claimed in claim 2, wherein the capacitances of the elemental capacitors in an arbitrary column are twice those of corresponding elemental capacitors in the preceding column as viewed from the first column toward the last column.

* * * * *